(12) United States Patent
Baentsch

(10) Patent No.: US 6,264,108 B1
(45) Date of Patent: Jul. 24, 2001

(54) PROTECTION OF SENSITIVE INFORMATION CONTAINED IN INTEGRATED CIRCUIT CARDS

(75) Inventor: Michael Baentsch, Langnau (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/327,067

(22) Filed: Jun. 7, 1999

(30) Foreign Application Priority Data

Jun. 8, 1998 (EP) .................................................. 98110425

(51) Int. Cl.[7] .................................................. G06K 19/00
(52) U.S. Cl. ........................................... 235/487; 235/380
(58) Field of Search .................................. 235/487, 492, 235/380, 382

(56) References Cited

U.S. PATENT DOCUMENTS

| | | | | |
|---|---|---|---|---|
| 5,353,350 | * | 10/1994 | Unsworth et al. | 380/3 |
| 5,497,140 | * | 3/1996 | Tuttle | 342/51 |
| 5,549,115 | * | 8/1996 | Morgan et al. | 128/696 |
| 5,577,121 | * | 11/1996 | Davis et al. | 380/24 |
| 5,832,207 | * | 11/1998 | Little et al. | 395/186 |
| 6,068,192 | * | 5/2000 | McCabe et al. | 235/487 |

* cited by examiner

Primary Examiner—Karl D. Frech
Assistant Examiner—Daniel St. Cyr
(74) Attorney, Agent, or Firm—Ratner & Prestia

(57) ABSTRACT

An integrated circuit card comprises a shield for detecting an intrusion, a protection unit for controlling the erasure or destruction of sensitive information, and power interrupt circuitry which maintains the power if no external power is supplied. The shield informs the protection unit if an intrusion is detected and the protection unit controls the erasure or destruction of said sensitive information. The power interrupt circuitry maintains power for erasure or destruction of information if no external power is supplied.

22 Claims, 4 Drawing Sheets

PROTECTION OF SENSITIVE INFORMATION CONTAINED IN INTEGRATED CIRCUIT CARDS

FIELD OF THE INVENTION

The present invention relates to integrated circuit cards, such as smartcards, in general, and a scheme for the intrusion protection of such cards in particular.

BACKGROUND OF THE INVENTION

Integrated circuit cards (ICCs), more widely known as smartcards, are small credit card size carriers containing electronics. The smartcard concept began in Europe prior to 1985, and is today being used in telephone systems, toll roads, game parlors, and personal computers, just to mention some applications.

In the following, the term integrated circuit card will be used, because ISO uses the term to encompass all those devices where an integrated circuit is contained within a card-size piece of plastic, or the like.

So far, ICCs have only been used in one of two ways. Either, the ICCs provide simple, more or less tamper-proof storage for small amounts of data, or they execute simple security-related operations like data signature, or encryption-based authentication, e.g., employing a challenge-response protocol. Some applications like pre-paid telephone or cinema cards, as well as health care cards storing personal data make use of the first property. ICCs in the second domain are used as secure tokens executing authentication procedures for example during computer system logon, or when opening appropriately equipped doors for access to a restricted area.

Typical ICCs supporting the above two modes of operation comprise a microprocessor (central processing unit, CPU), a read-only memory (ROM), a random-access memory (RAM), and some type of non-volatile, programmable memory, such as an EEPROM (electrically erasable programmable read only memory). In addition, an ICC usually comprises some kind of a bus (such as a serial bus) and I/O ports for interconnection to a card terminal and for communication with the outside world. Such a card terminal provides the necessary power, electric signaling at the hardware level, as well as the basic communication protocols at the software level to interact with the ICC. Two types of card terminals are available. The more expensive model physically locks the ICC as a whole. Alternatively, and in order to reduce cost of card terminals, it is also very common to only provide a slot into which the user can insert and from which he can retract the ICC at will.

Most ICCs comprise components in the form of integrated circuits which are molded together on a flexible card (e.g., PVC or ABS). The dimension of these integrated circuits (ICs) is at most 25 mm$^2$ (silicon die size). A typical ICC has a size of 85.6 mm×53.98 mm×0.76 mm. It is to be expected that the ICCs' integrated circuits shrink in size and that these ICCs become more and more powerful, taking advantage of advanced semiconductor technology.

The contents of the ROM type of memory is fixed and may not be intended to be changed once manufactured. This is a low cost memory, in that it occupies minimum space on the substrate. A ROM is disadvantageous in that it cannot be changed and it takes several months to be produced. As opposed to this, an EEPROM is erasable by the user and can be rewritten many times. ROMs and EEPROMs are non-volatile. In other words, when the power is removed they still retain their contents. A RAM is a volatile memory and as soon as the power is removed, the data content is lost. A RAM, however, has the advantage that it is much faster than ROMs and EEPROMs. On the other hand, a RAM is more expensive in terms of die size.

ICCs come in two forms: contact and contactless. The former is easy to identify because of its gold connector I/O ports. Although the ISO Standard (7816-2) defined eight contacts, only six are actually used to communicate with the outside world. The contactless card may contain its own battery, particularly in the case of a "Super Smart Card" which has an integrated keyboard and LCD display. In general, however, the operating power is supplied to the contactless card electronics by an inductive loop using low frequency electronic magnetic radiation. The communications signals may be transmitted in a similar way or can use capacitive coupling or even an optical connection.

Recent advances in chip design enabled the introduction of FlashRAM for non-volatile memory and 32-bit microprocessors on the same silicon estate. Thus, ICCs are getting powerful enough to host simple, but nonetheless fully functional applications, by far exceeding the simple read/write, respectively encrypt/decrypt routines as outlined above. For example, complex security-related operations like full-blown cryptographic or electronic commerce protocols could be run on the card itself and need no longer reside on a more insecure personal computer.

It is a well known problem that information contained in an ICC cannot be adequately protected. Currently, an unauthorized person can fairly easily get access to information contained in an ICC by opening the card such that certain circuitry becomes accessible. This opens up possibilities to tamper with information contained in the respective ICC, or to read out confidential or proprietary information.

SUMMARY OF THE INVENTION

An integrated circuit card comprises a shield for detecting an intrusion, a protection unit for controlling the erasure or destruction of sensitive information, and power interrupt circuitry which maintains the power if no external power is supplied. The shield informs the protection unit if an intrusion is detected and the protection unit controls the erasure or destruction of said sensitive information. The power interrupt circuitry maintains power for erasure or destruction of information if no external power is supplied.

A card terminal may optionally report an intrusion.

BRIEF DESCRIPTION OF THE DRAWINGS

The invention is described in detail below with reference to the following schematic drawings. It is to be noted that the Figures are not drawn to scale.

DETAILED DESCRIPTION OF THE INVENTION

The basic concept of the present invention is described in the following. Before addressing different embodiments, relevant terms and expressions are defined and explained.

The expression "sensitive information" is herein used to describe any kind of proprietary, confidential, or critical information contained in or processed by an ICC. Examples are: medical information about the card holder; cryptographic keys, e.g., for the coding/encoding of communication between the ICC and a host computer; financial data; PIN (personal identifier number) codes or PIN-coded related information as used to access bank services and the like.

The word "intrusion" is herein used to describe any manipulation, encroachment, infringement, interference, interruption, invasion, trespass, or violation of an ICC. Usually, an intruder tries to get access to sensitive information contained in, or processed by an ICC. This is, for example, done by means of electrodes that are positioned such that information contained in a chip, or transmitted via an ICC internal bus are made accessible from outside the card. There are two different manipulation approaches. Either an intrusion is performed in a way that information contained in a memory card can be read, or an intrusion is carried out such that the exchange of information within the card can be monitored and/or recorded.

The word "erase" means to delete or discard information, whereas the word "destroy" is herein used to describe a process of intentionally altering information such that it cannot be reconstructed any more by an unauthorized person, or such that it can only be reconstructed if a suitable key is available.

Figure 1:
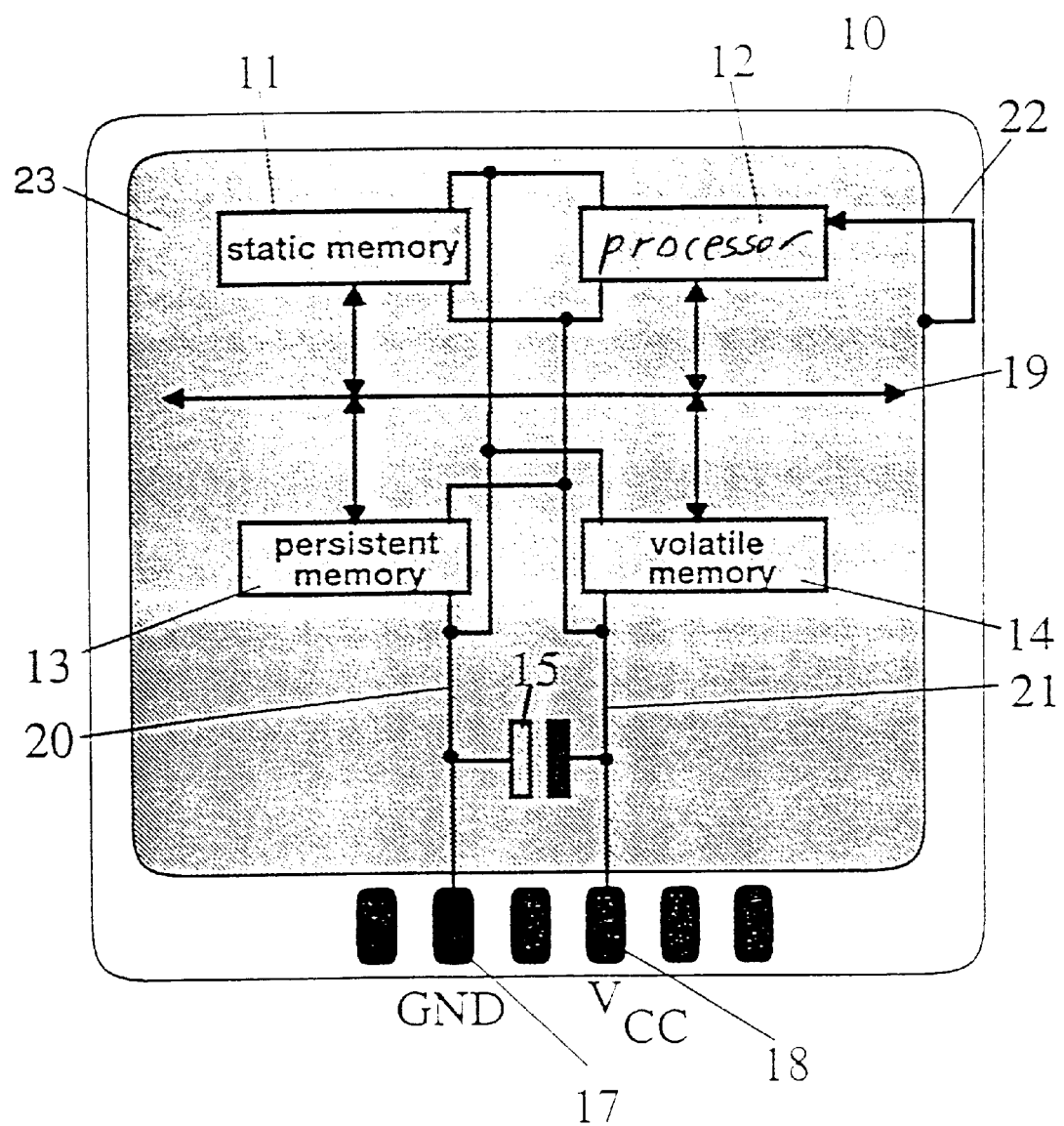
FIG. 1 is a schematic view of a first exemplary embodiment of the present invention.

A first exemplary embodiment of the present invention is illustrated in FIG. 1. In this figure, an integrated circuit card (ICC) 10 is shown. This card carries a processor (e.g., CPU) 12, a static memory (such as a ROM) 11, a persistent memory (such as an EEPROM) 13, and a volatile memory (such as a RAM or register) 14. Each of these memories include contents. Contents includes, for example, data used or generated by the processor, or instructions which effect operation of the processor (or a portion thereof). The ICC 10 furthermore comprises an internal bus 19, which allows exchange of information and signaling between the ICC's components. This internal bus 19 is not connected to the input/output (I/O) ports which are shown as contact pads. To prevent manipulation of ICCs, usually only very limited access to data streams is provided. The processor 12 communicates via the I/O ports with the card terminal (not shown in FIG. 1). This communication may be encrypted.

The ICC 10 is a contact card. The I/O ports connect to corresponding means of a card terminal. As indicated in FIG. 1, power is supplied via port 17 (ground, GND) and port 18 (positive voltage, $V_{cc}$). The voltage between these two ports 17 and 18 is applied to the components 11, 12, 13 and 14 of the ICC 10. Since there is no battery integrated into card 10, these components desirably rely on the external power supply.

Most ICCs contain sensitive information which should not be accessible to unauthorized persons. According to an exemplary embodiment of the present invention, the sensitive information is protected as follows. The ICC is capable of detecting an intrusion. As illustrated in FIG. 1, a shield 23 (a membrane configuration that covers at least part of the ICC) might serve this purpose. Such a shield 23 can be designed such that any mechanical violation triggers a signal, for example. Likewise, one might use a pressure sensitive membrane configuration that triggers a signal if somebody touches the ICC with a pressure above a certain threshold, e.g., by using a needle or other tool. As shown in FIG. 1, the shield 23 might cover at least those portions of the ICC 10 that carry sensitive information, or that need to be protected for other reasons.

Such a shield might comprise a laminar configuration of a flexible cover membrane, an actuator membrane and a switch contact membrane, similar to configurations used in connection with touch sensitive displays, for example. The actuator membrane and switch contact membrane are electrically isolated by an air gap or other means. When the shield is touched with sufficient pressure, the two membranes are forced together, resulting in current flow at the point of touch. This current flow might be used as an indication that somebody tried to intrude the ICC. The shield's sensitivity is usually defined by the flexibility of the cover membrane. The less flexible the cover membrane is, the more pressure is to be applied before a signal is triggered. Such a membrane configuration can be designed such that the shield reacts if somebody tries to destroy or penetrate the shield.

Examples of touch sensitive shields and other kinds of shields are to described in IBM Technical Disclosure Bulletin, "Shielding and Vandal Protection for Touch Sensitive Panel", Vol. 04–73, pp. 3575–3576; IBM Technical Disclosure Bulletin, "Identification and Verification of Signatures", Vol. 39, no. 6, 06–96, pp. 93–98; and U.S. Pat. No. 5,717,321, "Drive Current Calibration for an Analog Resistive Touch Screen", which is incorporated by reference.

Suitable is a shield (which might be similar or comparable to a so-called analog resistive touch panel) that consists of a base layer with Indium Tin Oxide (ITO) coating covered by a top sheet of conductive mylar foil. The mylar top sheet does not touch the base layer under normal circumstances, only when somebody tries to destroy the shield, there is a small contact area at the respective location. The top sheet might serve as "signal pick-up". The shield might either be energized by a current or a voltage. The layers (membranes) of the shield serve like a switch if a certain pressure is applied. If the membranes touch each other, the switch is closed and an intrusion is signaled.

Furthermore, the ICC comprises power interrupt circuitry 15 maintaining power for a short period of time if no external power is supplied. As shown in FIG. 1, a special capacitor 15 is employed in the present example. This capacitor 15 is placed such that the voltage between the GND line 20 and Vcc line 21 can be maintained for a short period of time. On a subsequent power-up, capacitor 15 is automatically recharged. It is recommended to place shield 23 such that capacitor 15 and its circuit lines are protected.

It is difficult to implement the above described capacitor 15 in an ICC 10, because the real estate for circuitry is limited, the cards have to be thin, flexible, low cost and very reliable. In addition, capacitor 15 has to be able to keep sufficient energy (high capacitance) for voltage maintenance during a predetermined period of time.

The standard capacitor discharge model can be used to estimate the capacitance required to provide sufficient energy while information is erased or destroyed. The discharge model is based on a resistor R discharging a capacitor C. The differential equation for the voltage at C is at any given time into the discharge:

$$U_c(t) + R \cdot C \cdot \frac{d}{dt} U_c(t) = 0$$

This equation is solved for capacitor's voltage at any time during discharge $[U_c(t)]$ to:

$$U_c(t) = U_0 \cdot e^{-t/(R \cdot C)}$$

The required capacity to maintain a voltage of U after t seconds into the discharge results in:

$$C = \frac{t}{(R \cdot \ln U / U_0)}$$

Setting R as $U_{cc}I_{cc}$ with $U_{cc}$ being the supply voltage of the non-volatile memory 13 (e.g., an AMD FlashRAM Am29LV002 with $U_{cc}$=3V, as described in "Am29LV002 Specifications", AMD Corp. Publication No. 21191, January 1998) and $I_{cc}$ being the current required to erase or destroy the sensitive information, C can be computed.

To achieve the required capacitance, special capacitors with high capacitance are required which can be integrated into an ICC. Capacitors suited for usage in connection with the present invention should have an extremely high capacitance in the order of several Farads per $cm^2$. In the present context so-called HiCap capacitors, or super capacitors (SuperCap) are employed. A SuperCap is a high capacitance value multi-layer ceramic capacitor (also referred to as MLC) which comprises a stack of several ceramic layers found using ceramic tapes which are a few microns thick.

These capacitors can be used in an ICC environment if designed appropriately, as demonstrated and reported by M. G. Sullivan et al. in "An Electrochemical Capacitor Using Modified Glassy Carbon Electrodes", Electrochemical Capacitors II, Proceedings Vol. 96–25, pp. 192–201, The Electrochemical Society, Inc., 10 South Main Street, Pennington, N.J., 1997.

In addition to the intrusion detector (i.e., shield) and the power interrupt circuitry, processor 12 comprises an information protection unit that controls the erasure or destruction of sensitive information. The information protection unit may be located either physically in or external to the other components which comprise processor 12.

According to the present embodiment, the information protection unit comprises a software component, referred to as software information protection handler (not shown), which controls the erasure or destruction of sensitive information, or which performs the actual erasure or destruction of such information. This software information protection handler is part of the information protection unit and might be implemented as fixed handler in a ROM causing processor 12 to execute the steps shown in FIG. 2A. The information protection handler might also cause the processor to execute certain steps each time before an ICC is used, or after an ICC was lost and found. Exemplary steps are illustrated in FIG. 2B.

Shield 23 detects an intrusion and signals (intrusion detected) via line 22 to the information protection unit that an intrusion has been detected. In the present exemplary embodiment, the software information protection handler initiates a short sequence of steps for the erasure or destruction in case no power is available such that the whole process works even if the external power supply is interrupted.

Instead of a software information protection handler, a custom information protection circuitry might be provided to handle the erasure or destruction in case of an intrusion. Such a custom information protection circuitry is illustrated in connection with the second embodiment (see FIG. 3).

Figure 2A:
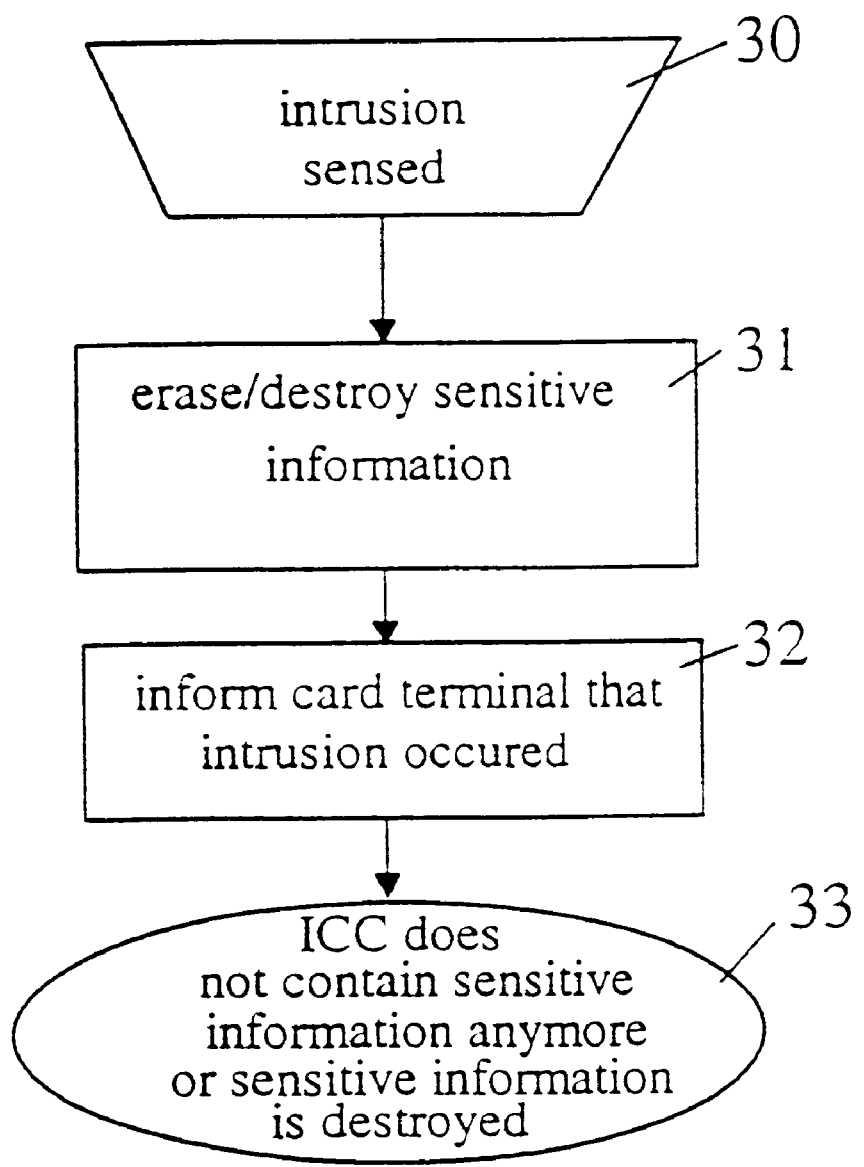
FIG. 2A is a flowchart diagram used to illustrate the process steps which are carried out in a system, according to an exemplary embodiment of the present invention, if an intrusion occurs.
Figure 2B:
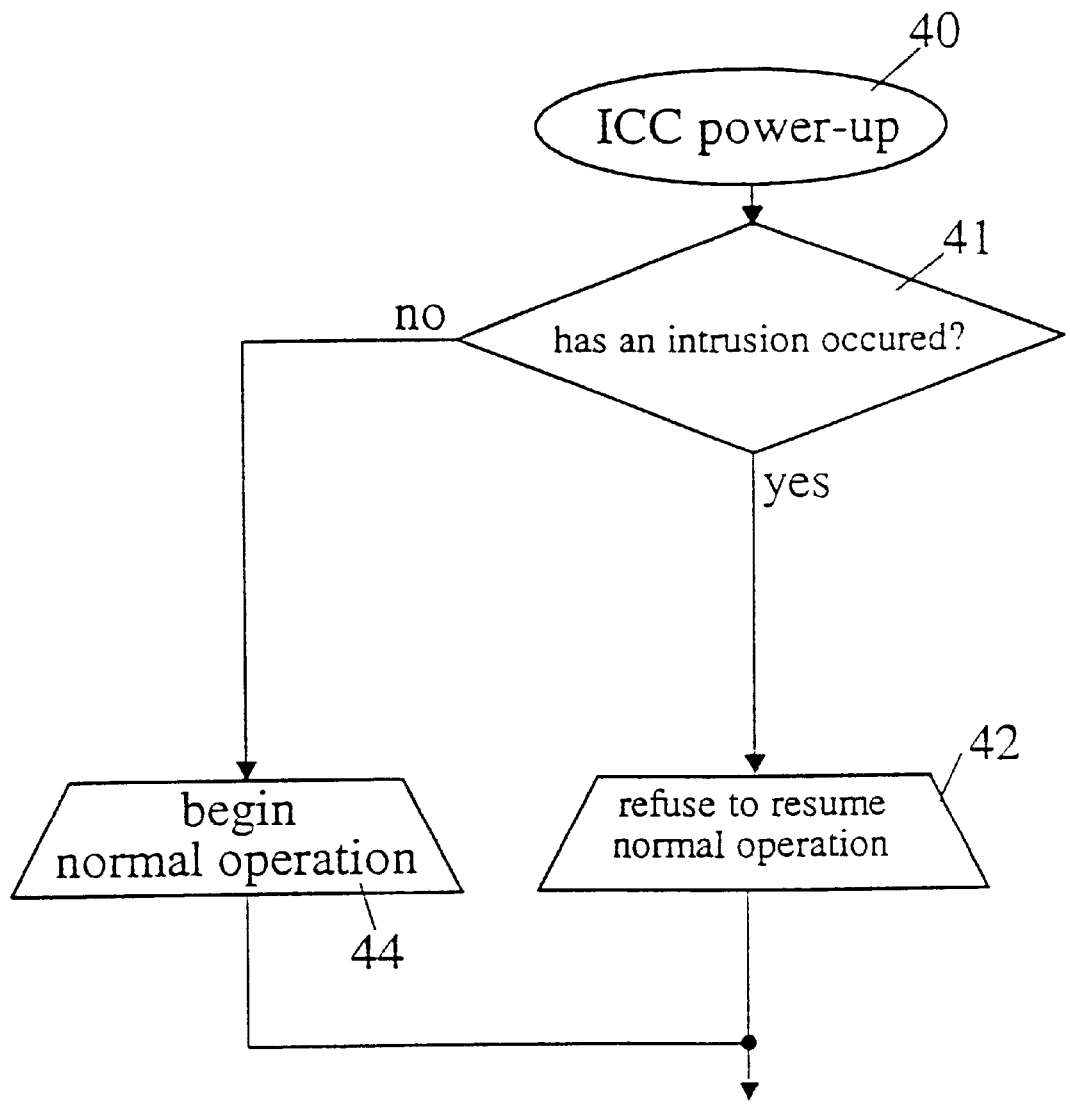
FIG. 2B is a flowchart diagram used to illustrate the process steps which are carried out in a system, according to an exemplary embodiment of the present invention if an ICC is used, e.g., after an intrusion.

Turning now to FIG. 2A, the steps are addressed which are carried out by an ICC 10.

First, an intrusion is sensed by an appropriate detector, e.g., shield 23, as illustrated in step 30. In the next step (step 31), the sensitive information contained in the ICC (e.g., in persistent memory 13, is erased or destroyed to protect it against unauthorized access. Then, the fact that an intrusion occurred might be signaled to the card terminal, as indicated in step 32 (please note that this step is optional). The card terminal then might notify a server. The respective ICC might be put on a watch list in the server, or the access rights, credit limits and so forth might be changed so that the ICC cannot be used to do any harm (e.g., by transferring money or accessing a restricted area).

After completion of these steps, the ICC does not comprise any sensitive information anymore, or the sensitive information has been altered (destroyed) such that an unauthorized person cannot use it anymore (see step 33). If the power was interrupted prior to the intrusion or during the intrusion, the necessary power is provided by the power interrupt circuitry.

The information protection means might be designed such that the processor goes into a suspend mode and terminates certain processes or shuts down components within the ICC that consume power before the power interrupt circuitry runs out of energy.

Future ICCs (e.g., JavaCards) will be manufactured partially blank, or without an application program stored thereon, and an application program will then be loaded into the changeable memory (i.e., by downloading it from a computer). In this manner, the application program in an ICC may be changed by an authorized party. The software component constituting the software part of the information protection means might also be loaded into the ICC, but the hardware—according to the present invention—needs to be present.

If the ICC is powered up again, a few steps might be carried out so that the ICC can resume operation as if no intrusion had occurred. This process can either be carried out anytime an ICC is used, or only if there are certain indications that an intrusion took place, or if there is a certain likelihood that an is intrusion might have occurred. A typical example is the situation where a card was lost or stolen and the legitimate owner gets it back after a while.

The respective optional process steps are shown in FIG. 2B. If an ICC is placed in a card terminal, external power is applied (step 40) and an optional check might be performed to determine whether an intrusion occurred (see step 41). This can be done by checking whether the sensitive information (e.g., an encryption key) can be verified as being present or uncorrupted on the ICC. If the sensitive information cannot be verified as being present on the ICC, or if the sensitive information is corrupted, then an intrusion has to be inferred. It is now possible for the ICC to refuse to resume normal operation, as indicated in step 42. If no intrusion occurred, then the ICC can resume normal operation (step 44). Before normal operation is resumed, one might also check the server to find out whether any intrusion was signaled by the respective ICC to the system. Should this be the case, normal operation might be refused.

Likewise, the ICC state might be reestablished after an intrusion by loading the missing or destroyed information through the card terminal. The card holder might also be prompted to send the ICC to the company who issued it allowing them to withdraw or reestablish it. These approaches are not as safe as the one described in the above section where an ICC is not allowed to be reused after an intrusion was detected.

As far as an application running on an ICC is concerned, several scenarios are possible. The application program developer may not have considered protecting sensitive information at all. In most cases, this no longer is any problem when using the inventive approach, as one might for example decide to erase or destroy any information in certain memories, sections of memories, or registers. ICC applications can be improved by defining how an application is supposed to react if an intrusion is detected and information is automatically erased or destroyed. It might be advisable to protect certain transactions or to terminate them in case of an intrusion to prevent unauthorized access to the card terminal and/or server.

Certain ICCs require an external clock signal to be provided by the card terminal. If somebody tries to manipulate such an ICC, the clock signal might be interrupted such that no clock signal is available to the ICC anymore. This could lead to problems, such as a undefined state, if the ICC comprises circuitry which cannot be driven without a clock signal. To avoid such a situation, the ICC might comprise special means that provide a clock signal.

In the following, a second exemplary embodiment of the present invention is described. This embodiment is outlined in connection with FIG. 3.

Figure 3:
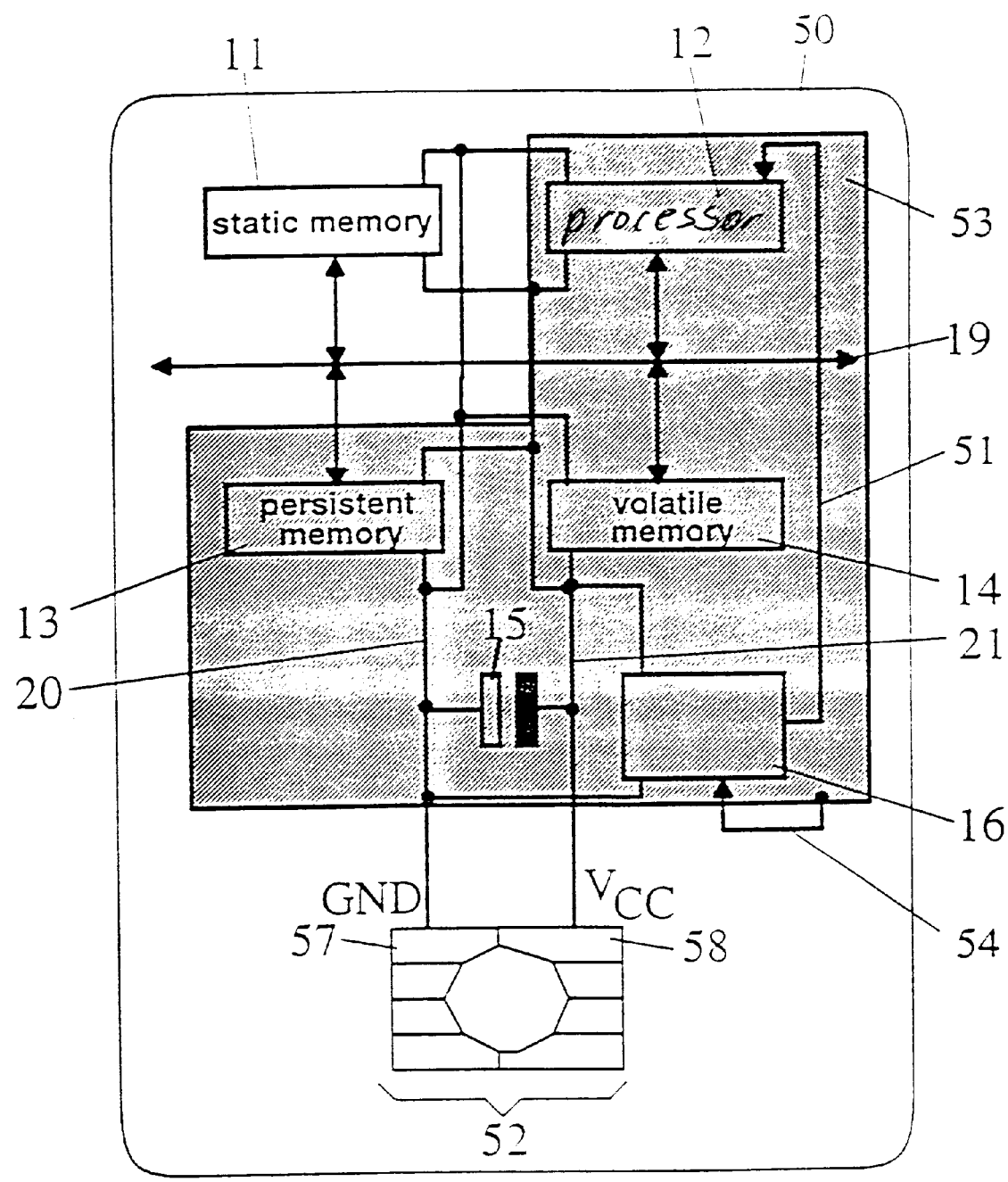
FIG. 3 is a schematic top view of a second exemplary embodiment of the present invention.

ICC 50 comprises typical power coupling means 52, which are arranged as defined by the ISO standard 7816. External power is applied to ICC 50 by means of the contact pads 57 (GND) and 58 ($V_{cc}$) and thus to power lines 20 and 21. These power lines are coupled to volatile memory 14 and other components to provide a normal and/or standby voltage. ICC 50 comprises a capacitor 15 (likewise several capacitors might be arranged in parallel) serving as power interrupt circuitry, and a clock generator (not shown). Inventive ICC 50 furthermore comprises a custom information protection circuitry 16. As shown in FIG. 3, this information protection circuitry 16 might be connected to processor 12. In addition, it might be connected to internal bus 19 so that it can communicate with certain components of ICC 50. As in the first embodiment, shield 53 serves as means for the detection of an intrusion. It is to be noted that shield 53, as employed on ICC 50, is designed to protect only CPU 12, persistent memory 13, volatile memory 14, information protection circuitry 16 and capacitor 15. Shield 53 signals to information protection circuitry 16 that an intrusion occurred. For this purpose, information protection circuitry 16 and shield 53 are interconnected by signaling line 54. ICC 50 behaves similar as ICC 10, except that the steps illustrated in FIGS. 2A (and possibly 2B) are carried out, or are controlled by information protection circuitry 16.

There are different ways to realize the intrusion detector and the information protectionunit, according to the present invention. One can use off-the-shelf components (e.g., a processor and a non-volatile memory) together with an appropriate software component, or discrete hardware. Well suited are ASICs (application specific integrated circuits), provided that they can be integrated onto an ICC card.

The scheme for the protection of sensitive information can provide a significant competitive edge over a conventional ICC since it allows information to be processed and carried in an ICC which would otherwise not be adequately protected.

By over-dimensioning the capacitor, some current can be retained even after erasure or destruction of sensitive information. This current can then be used to feed a reporting mechanism. Card Terminals can be improved by adding features that allow the reporting of an intrusion event to another system, such as a remote control station or operator console. The event reporting feature might be used to track down problems, to monitor events, and for record keeping purposes. An improved card terminal might comprise event reporting means that receives input from the ICC if an intrusion was detected by the ICC. This can, for instance, be realized in that the respective signal (intrusion detection) is made available at one of the ICC ports. The card terminal can either report an intrusion using standard event reporting methods or by specially designed means.

The ICCs described in connection with the present invention, as well as other ICCs improved by adding the inventive components, might be used for any different purposes and in connection with various applications and solutions.

Even if an ICC is used in connection with a "secure" card terminal in which the ICC is fully enclosed and secured by the engaging latch, an intrusion might occur. The invention also works in such a situation, provided the intrusion detection means actually detected the intrusion, and sensitive information is erased or destroyed before it can be accessed from outside.

The present invention allows conventional ICCs to be modified by simply integrating the essential components either as hardware, or as a combination of hardware and software.

The inventive approach facilitates the protection of sensitive information contained in an ICC. It is an advantage of the present invention that it works autonomously even in case that no external power is supplied to the ICC. The implementation of the invention is not expensive and is well suited for mass-fabrication. The invention can be easily implemented in current and future ICCs.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An integrated circuit card, comprising:

a processor unit for executing a plurality of instructions;

a memory, coupled to said processor, and having contents which are used or generated by said processor;

a shield situated over at least said memory for providing an indication responsive to deflection or penetration of said shield;

said processor including a protection unit which controls removal of said contents from said memory responsive to said indication from said shield; and a power circuit for providing power so that said protection unit functions if a source of power external to said integrated circuit card is unavailable;

wherein said processor unit terminates selective processes executing in said integrated circuit card and powers down selective components of said integrated circuit card when said source of power external to said integrated circuit card is unavailable, wherein said integrated circuit card is a single integrated device.

2. An integrated circuit card according to claim 1, wherein said processor executes said instructions responsive to a first clock signal transmitted from a source external to said integrated circuit card, and said processor executes said instructions responsive to a second clock signal transmitted from a source internal to said integrated circuit card responsive to deflection or penetration of said shield.

3. An integrated circuit card according to claim 2, further comprising a clock generator for generating said clock signal.

4. An integrated circuit card according to claim 1, wherein said power circuit includes at least one capacitor which maintains sufficient power to accomplish removal of said contents from said memory, said capacitor having a capacitance of at least one farad per $cm^2$.

5. The integrated circuit card of claim 4, wherein said capacitor is a multi-layer ceramic capacitor which comprises a stack of several layers constructed with ceramic tape.

6. An integrated circuit card according to claim 1, wherein said power circuit is charged by being coupled to an external source of power.

7. An integrated circuit card according to claim 1, wherein said memory includes a register device.

8. An integrated circuit card according to claim 1, further comprising an indicator for indicating that removal of said contents from said memory has been accomplished.

9. An integrated circuit card according to claim 1, wherein said protection unit includes firmware for accomplishing removal of said contents from said memory.

10. An integrated circuit card according to claim 1, wherein said protection unit includes an ASIC for accomplishing removal of said contents from said memory.

11. An integrated circuit card according to claim 1, further including a plurality of contacts for providing to an external device at least one of a) said contents or b) process contents obtained using said contents.

12. An integrated circuit card according to claim 1, wherein said shield includes a plurality of membranes which when deflected provide current flow in order to indicate deflection thereof.

13. An integrated circuit card according to claim 1, wherein removal of said contents includes erasure of said contents.

14. An integrated circuit card according to claim 1, wherein removal of said contents includes modification of said contents to form modified contents so that said contents are obtainable from said modified contents via a reconstructive process.

15. A method of protecting an integrated circuit card which includes a processor and memory, said method comprising the steps of:

executing a plurality of instructions within said processor;

storing contents within said memory, said contents used or generated by said processor;

receiving an indication of deflection or penetration of a surface over said memory;

storing power within said integrated circuit card;

terminating selective sequences executing in said integrated circuit card and powering down selective components of said integrated card when a source of power external to said integrated circuit card is unavailable; and removing said contents from said memory using said stored power and responsive to said indication of deflection.

16. A method of protecting an integrated circuit card according to claim 15, further comprising the step of providing indication that removal of said contents from said memory has been accomplished.

17. A method of protecting an integrated circuit card according to claim 15, wherein removal of said contents includes erasure of said contents.

18. A method of protecting an integrated circuit card according to claim 15, wherein removal of said contents includes modification of said contents to form modified contents so that said contents are obtainable from said modified contents via a reconstructive process.

19. An article of manufacture comprising a computer useable medium having computer readable program code means embodied therein for protecting an integrated circuit card which includes a processor and a memory, the computer readable program codes means in said article of manufacture comprising computer readable program code means for causing a computer to effect:

executing a plurality of instructions within said processor;

storing contents within said memory, said contents used or generated by said processor;

receiving an indication of deflection or penetration of a surface over said memory;

obtaining power stored within said integrated circuit card;

terminating selective sequences executing in said integrated circuit card and powering down selective components of said integrated card when a source of power external to said integrated circuit card is unavailable; and removing said contents from said memory using said stored power and responsive to said indication of deflection.

20. An article of manufacture as recited in claim 19, the computer readable program code means in said article of manufacture further comprising computer readable program code means for causing a computer to effect:

indicating that removal of said contents from said memory has been accomplished.

21. A program storage device readable by machine, tangibly embodying a program of instructions executable by the machine to perform method steps for protecting an integrated circuit card which includes a processor and memory, said method comprising the steps of:

executing a plurality of instructions within said processor;

storing contents within said memory, said contents used or generated by said processor;

receiving an indication of deflection or penetration of a surface over said memory;

obtaining power which is stored within said integrated circuit card;

terminating selective sequences executing in said integrated circuit card and powering down selective components of said integrated card when a source of power external to said integrated circuit card is unavailable; and removing said contents from said memory using said stored power and responsive to said indication of deflection.

22. A computer program product comprising a computer useable medium having computer readable program code means embodied therein for causing protection of an integrated circuit card which includes a memory, said method comprising the steps of:

executing a plurality of instructions within said processor;

storing contents within said memory, said contents used or generated by said processor;

receiving an indication of deflection or penetration of a surface over said memory;

obtaining power which has been stored within said integrated circuit card;

terminating selective sequences executing in said integrated circuit card and powering down selective components of said integrated card when a source of power external to said integrated circuit card is unavailable; and removing said contents from said memory using said stored power and responsive to said indication of deflection.

* * * * *